United States Patent
Saho et al.

[19]

[11] Patent Number: 6,098,838
[45] Date of Patent: Aug. 8, 2000

[54] BULK FEEDER

[75] Inventors: Hidehiro Saho, Saga-ken; Yuji Tanaka, Kurume, both of Japan

[73] Assignee: Matsushita Electric Industrial Co., Ltd., Osaka, Japan

[21] Appl. No.: 09/097,683

[22] Filed: Jun. 16, 1998

[30] Foreign Application Priority Data

Jun. 30, 1997 [JP] Japan ................................ 9-173555

[51] Int. Cl.[7] .............................. B23Q 7/12; B65H 9/00
[52] U.S. Cl. ...................... 221/163; 221/200; 221/167; 221/254
[58] Field of Search ................................... 221/159, 160, 221/167, 163, 168, 171, 200, 202, 203, 254, 262

[56] References Cited

U.S. PATENT DOCUMENTS

| | | | |
|---|---|---|---|
| 3,039,531 | 6/1962 | Scott | 221/168 X |
| 4,201,313 | 5/1980 | Kirsch | 221/171 |
| 4,721,230 | 1/1988 | McKnight | 221/171 X |
| 4,828,142 | 5/1989 | McKnight | 221/171 |
| 4,953,749 | 9/1990 | Kubota et al. | |
| 5,054,363 | 10/1991 | Scharch | 221/254 X |

FOREIGN PATENT DOCUMENTS

| | | |
|---|---|---|
| 69503566 | 5/1995 | Germany. |
| 196 02 309 | 7/1996 | Germany. |
| 08048419 | 2/1996 | Japan. |

Primary Examiner—Christopher P. Ellis
Assistant Examiner—Gene O. Crawford
Attorney, Agent, or Firm—Stevens, Davis, Miller & Mosher, L.L.P.

[57] ABSTRACT

In a bulk feeder, chips, stored randomly in a storage chamber, are fed one by one into a pipe extending vertically downwardly from the bottom of the storage chamber, and are further sequentially fed to a pickup position. In order to prevent the incomplete feeding of the chips into the pipe, an outer tube is provided in a manner to insert the pipe into the outer tube, and two projections are formed around an outer peripheral surface of the outer tube, and a pin is received between the two projections. The pin is rotated by a motor in eccentric relation to a horizontal axis of rotation of this motor, and the outer tube, while rotating, moves upward and downward, so that an upper end portion of the outer tube projects upwardly beyond an upper end of the pipe. As a result, the outer tube breaks into and disperses the group of chips residing above the pipe, so that the chips can be fed one by one into the pipe, and then the chips are fed sequentially to the pickup position.

6 Claims, 2 Drawing Sheets

BULK FEEDER

BACKGROUND OF THE INVENTION

FIELD OF THE INVENTION

This invention relates to a bulk feeder in an apparatus for mounting electronic parts, which feeder supplies chips to be mounted on a board.

RELATED ART

With respect to an electronic parts-mounting apparatus, there are known various systems for supplying chips (electronic parts) to be mounted on a board, and examples of such systems include a tape feeder, a tube feeder, a tray feeder and a bulk feeder. Among these, the bulk feeder is particularly excellent as a system for supplying small-size chips to be used in a large amount, and various constructions of such bulk feeders have heretofore been proposed.

In a bulk feeder, chips, stored randomly in a storage chamber, are fed one by one into a pipe, extending vertically downwardly from the bottom of the storage chamber, and are sequentially transferred to a predetermined pickup position through the pipe. However, the chips within the storage chamber are, for example, jammed in the vicinity of the upper end of the pipe, and therefore the chips can not be easily fed positively one by one into the pipe. In order to overcome this difficulty, it has been proposed to provide means for applying vibrations to the storage chamber, and also there has been proposed another means (as disclosed in JP-A1-8-48419) in which the pipe is inserted or fitted in an outer tube or pipe, and the outer tube is moved upward and downward to break into and disperse a group of chips gathered together in the vicinity of the upper end of the pipe so that the chips within the storage chamber can be fed one by one into the pipe.

However, none of the above conventional means have been found sufficiently effective for overcoming the above problem, and the incomplete feeding of the chips into the pipe has still been liable to occur.

SUMMARY OF THE INVENTION

It is therefore an object of this invention to provide a bulk feeder which prevents the incomplete feeding of chips into a pipe.

According to the present invention, there is provided a bulk feeder comprises:

a storage chamber for storing chips randomly therein;

a pipe extending substantially vertically downwardly from a bottom of the storage chamber so as to feed the chips, stored within the storage chamber, downwardly through the pipe;

an outer tube into which the pipe is inserted; and drive means for effecting an upward-downward movement and rotational motion of the outer tube at the same time while projecting an upper portion of the outer tube into the storage chamber.

Preferably, the drive means comprises a pair of vertically-spaced projections formed around an outer peripheral surface of the outer tube, a pin received between the pair of projections, and rotation means for rotating the pin in eccentric relation to a horizontal axis of rotation of the rotation means.

With the above construction, the outer tube, while rotating, moves upward and downward, and the upper end portion of the outer tube breaks into and disperses the group of chips, residing in the vicinity of the upper end of the pipe, so that the chips can be positively fed one by one into the pipe.

DESCRIPTION OF THE PREFERRED EMBODIMENT

Figure 1:
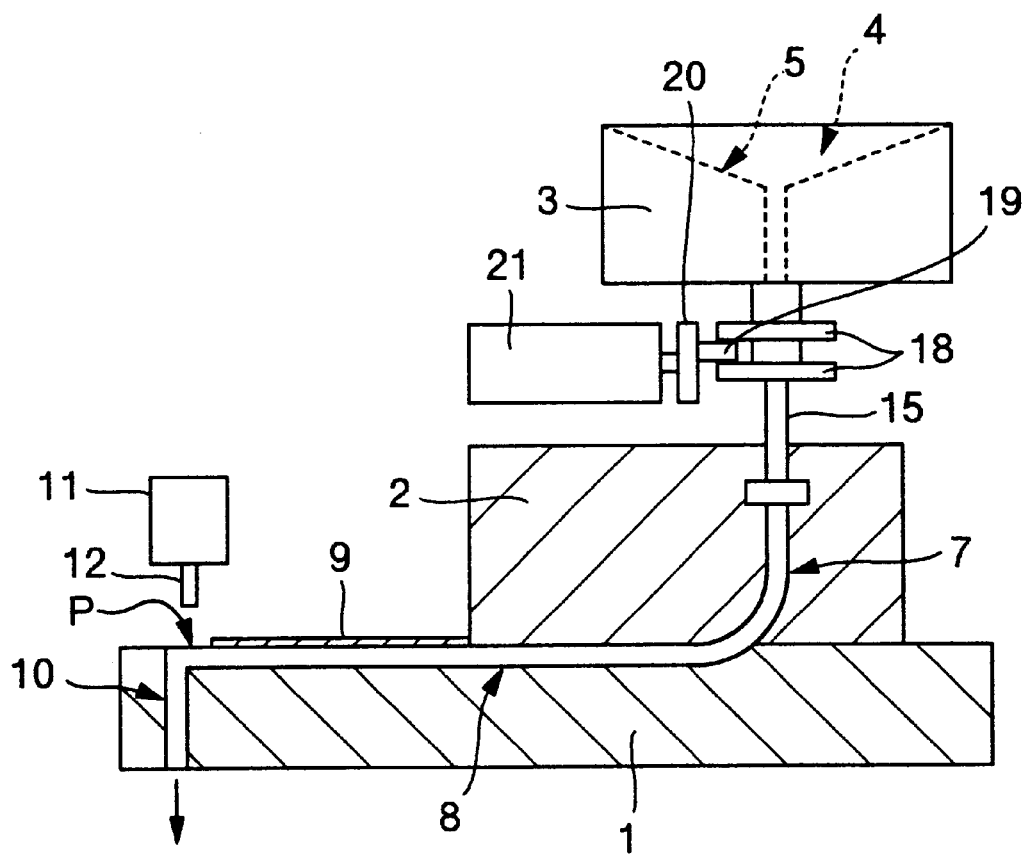
FIG. 1 is a cross-sectional view of one preferred embodiment of a bulk feeder according to the present invention.

An overall construction of a bulk feeder according to the present invention will first be described with reference to FIG. 1. In FIG. 1, a block 2 is mounted on a rear portion of an upper surface of a long base 1. A chip storage member 3 is provided above the block 2. A storage chamber 4 is formed in the chip storage member 3. A bottom surface 5 of the storage chamber 4 is formed into a cone-shaped surface (that is, a tapering surface).

Figure 3A:
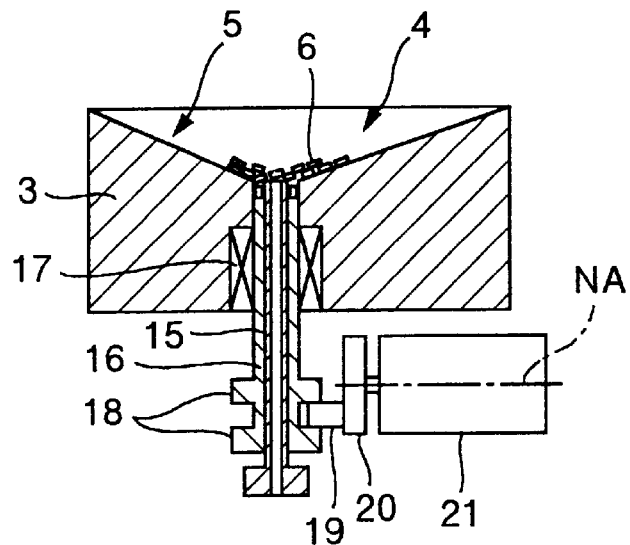
FIGS. 3A to 3C are cross-sectional views of a chip feed-out portion of the bulk feeder.

In FIG. 3A, small-size chips 6 are randomly stored in the storage chamber 4. A pipe 15 is provided in a bottom portion of the chip storage member 3, and extends vertically downwardly from the deepest portion of a bottom surface of the chip storage member 3. In FIG. 1, a lower end of the pipe 15 communicates with a tunnel-like hole 7 formed in the block 2, and the hole 7 communicates with a tunnel-like, horizontal groove 8 formed in the base 1. The groove 8 is covered with a cover plate 9. A distal end of the groove 8 communicates with a suction hole 10. When the groove 8 is evacuated into a vacuum by suction vacuum means (not shown), the chips 6 in the groove 8 are fed to a pickup position P at a front end portion of the base 1. A nozzle 12 of a transfer head 11 holds the chip 6, fed to the pickup position P, by suction, and picks it up, and transfers it onto a board (not shown). As means for feeding the chips 6 to the pickup position P through the groove 8, there may be used means for feeding the chips under positive pressure.

Figure 2:
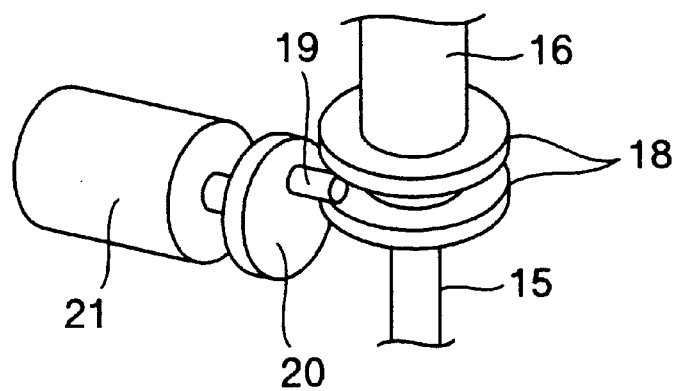
FIG. 2 is a perspective view of a drive portion for an outer tube of the bulk feeder in FIG. 1.

In FIG. 3A, the pipe 15 is inserted or fitted in an outer tube or pipe 16. A bearing 17 for the outer tube 16 is mounted in the chip storage member 3. A pair of flange-like projections 18 are formed around an outer peripheral surface of the outer tube 16 at a lower end portion thereof, and are spaced vertically from each other (see FIG. 2). A pin 19 is received between the two projections 18. The pin 19 is mounted on and projects from a disk 20 in eccentric relation to an axis of rotation of this disk 20. The disk 20 is driven and rotated by a motor 21 (see FIG. 1).

When the motor 21 is driven to rotate the disk 20, the pin 19 revolves around a horizontal center axis NA in eccentric relation to this center axis NA, so that the outer tube 16 is moved upward and downward. The pin 19 is held between the two projections 18, and is held in sliding, frictional contact with the two projections 18. Therefore, when the pin 19 revolves in eccentric relation to the center axis NA, the two projections 18 are rotated about the axes of the pipe 15 and outer tube 16 because of the sliding frictional force, so that the outer tube 16 is also rotated. As described above, when the motor 21 is driven, the vertical (upward and downward) movement and rotational motion of the outer tube 16 are effected at the same time.

Figure 3B:
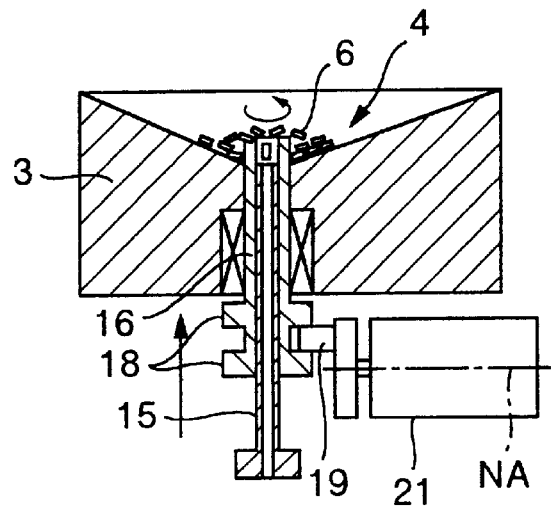
Figure 3C:
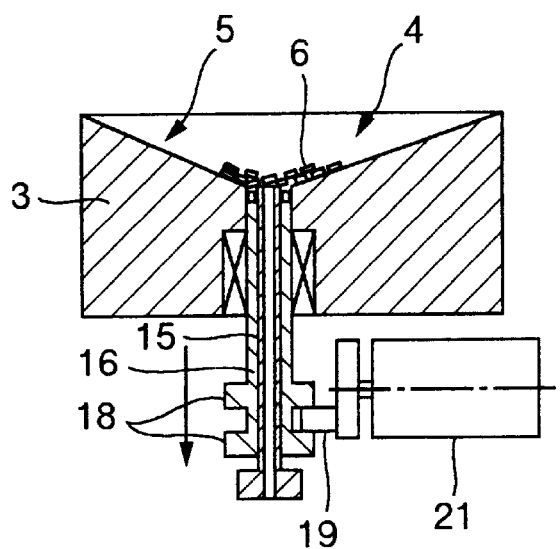

Next, the feeding of the chips into the pipe will be described with reference to FIGS. 3A to 3C. FIGS. 3A to 3C show the sequence of this feeding operation. In FIG. 3A, an upper end of the pipe 15 is disposed substantially at the same level as that of the deepest (lowermost) portion of the storage chamber 4, and an upper end of the outer tube 16 is disposed at a level slightly lower than that of the upper end of the pipe 15. When the motor 21 is driven, the outer tube 16 performs the vertical movement and the rotational motion as described above. As a result, the upper end of the outer tube 16 projects upwardly beyond the upper end of the pipe 15 to break into and disperse (or break up) a group of chips 6 residing at the bottom portion of the storage chamber 4 (see FIG. 3B), and then descends (see FIG. 3C). The outer tube 16 may rotate in one direction when moving upward and downward so as to facilitate the breakage of the group of chips 6.

Thus, the upper end portion of the outer tube 16, while rotating, projects into the storage chamber 4, and breaks into and disperses the group of chips 6 residing in the vicinity of the upper end of the pipe 15, so that the chips 6 can be fed one by one into the pipe 15. The chip 6, thus fed into the pipe 15, drops into the hole 7 (shown in FIG. 1), and further moves in the groove 8, and is fed to the pickup position P, and then is suction held by the nozzle 12 of the transfer head 11, and is picked up.

In the present invention, the outer tube is caused to perform the rotational motion and the vertical (upward and downward) movement at the same time to thereby break into and disperse the group of chips, residing above the pipe, so that the chips within the storage chamber can be positively fed one by one into the pipe. And besides, in the present invention, the rotational motion and vertical (upward and downward) movement of the outer tube can be simultaneously effected with the simple construction.

What is claimed is:

1. A bulk feeder comprising:

a storage chamber for storing chips randomly therein;

a pipe extending substantially vertically downwardly from a bottom of said storage chamber so as to feed said chips, stored within said storage chamber, downwardly through said pipe;

an outer tube into which said pipe is inserted; and drive means for effecting an upward-downward movement and rotational motion of said outer tube at the same time, while projecting an upper end portion of said outer tube into said storage chamber, wherein said drive means comprises a pair of vertically-spaced projections formed around an outer peripheral surface of said outer tube, a pin received between said pair of projections, and rotation means for rotating said pin in eccentric relation to a horizontal axis of rotation of said rotation means.

2. A bulk feeder according to claim 1, in which an upper end of said pipe is disposed substantially at the same level as that of the deepest portion of said storage chamber.

3. A bulk feeder comprising:

a storage chamber for storing chips randomly therein;

a pipe extending substantially vertically downwardly from a bottom of said storage chamber so as to feed said chips, stored within said storage chamber, downwardly through said pipe;

an outer tube into which said pipe is inserted; and drive means for effecting an upward-downward movement and rotational motion of said outer tube at the same time, while projecting an upper end portion of said outer tube into said storage chamber, wherein said outer tube, while moving upward and downward, rotates in one direction.

4. A bulk feeder according to claim 1, further comprising:

a bearing mounted in said storage chamber for contact with said outer tube.

5. A bulk feeder according to claim 1, further comprising:

a bearing mounted in said storage chamber for contact with said outer tube.

6. A bulk feeder comprising:

a storage chamber for storing chips randomly therein;

a pipe extending substantially vertically downwardly from a bottom of said storage chamber so as to feed said chips, stored within said storage chamber, downwardly through said pipe; and an outer tube into which said pipe is inserted, wherein said outer tube, while moving upward and downward, rotates in one direction.

* * * * *